United States Patent
Walther (10) Patent No.: US 6,716,727 B2
(45) Date of Patent: Apr. 6, 2004

(54) METHODS AND APPARATUS FOR PLASMA DOPING AND ION IMPLANTATION IN AN INTEGRATED PROCESSING SYSTEM

(75) Inventor: Steven R. Walther, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/007,530

(22) Filed: Oct. 26, 2001

(65) Prior Publication Data

US 2003/0082891 A1 May 1, 2003

(51) Int. Cl.⁷ .............................................. H01L 21/425
(52) U.S. Cl. ....................... 438/514; 438/506; 438/374; 438/480; 118/715; 365/178; 257/543; 427/526
(58) Field of Search .................... 438/513–516, 438/480–487, 506, 250, 373–374; 118/723 UE, 715; 365/178; 148/239; 427/526; 257/543; 414/935

(56) References Cited

U.S. PATENT DOCUMENTS

| | | |
|---|---|---|
| 3,908,183 A | 9/1975 | Ennis, Jr. |
| 4,276,477 A | 6/1981 | Enge |
| 4,283,631 A | 8/1981 | Turner |
| 4,899,059 A | 2/1990 | Freytsis et al. |
| 4,922,106 A | 5/1990 | Berrian et al. |
| 5,350,926 A | 9/1994 | White et al. |
| 5,354,381 A | 10/1994 | Sheng |
| 5,424,244 A * | 6/1995 | Zhang et al. ............... 437/173 |
| 5,452,177 A | 9/1995 | Frutiger |
| 5,711,812 A | 1/1998 | Chapek et al. |
| 5,907,158 A | 5/1999 | Nasser-Ghodsi et al. |
| 5,911,832 A | 6/1999 | Denholm et al. |
| 6,020,592 A | 2/2000 | Liebert et al. |
| 6,111,260 A | 8/2000 | Dawson et al. |
| 6,153,524 A | 11/2000 | Henley et al. |
| 6,182,604 B1 | 2/2001 | Goeckner et al. |
| 6,203,620 B1 * | 3/2001 | Moslehi ...................... 118/723 |
| 6,221,169 B1 * | 4/2001 | Bernstein et al. .............. 134/2 |
| 6,440,221 B2 * | 8/2002 | Shamouilian et al. ....... 118/724 |
| 2002/0090818 A1 * | 7/2002 | Thildervist et al. ......... 438/689 |
| 2002/0098713 A1 * | 7/2002 | Henley et al. ............. 438/776 |
| 2002/0125829 A1 * | 9/2002 | Velta ..................... 315/111.81 |
| 2002/0155679 A1 * | 10/2002 | Ogura et al. ................ 438/423 |

FOREIGN PATENT DOCUMENTS

WO  WO 99 06110 A1  2/1999

* cited by examiner

*Primary Examiner*—Matthew Smith
*Assistant Examiner*—Granvill D Lee, Jr.

(57) ABSTRACT

Methods and apparatus are provided for plasma doping and ion implantation in an integrated processing system. The apparatus includes a process chamber, a beamline ion implant module for generating an ion beam and directing the ion beam into the process chamber, a plasma doping module including a plasma doping chamber that is accessible from the process chamber, and a wafer positioner. The positioner positions a semiconductor wafer in the path of the ion beam in a beamline implant mode and positions the semiconductor wafer in the plasma doping chamber in a plasma doping mode.

33 Claims, 8 Drawing Sheets

METHODS AND APPARATUS FOR PLASMA DOPING AND ION IMPLANTATION IN AN INTEGRATED PROCESSING SYSTEM

FIELD OF THE INVENTION

This invention relates to processing of semiconductor wafers and, more particularly, to integrated processing systems and methods for doping a workpiece with impurity materials over a range of energies, including very low energies.

BACKGROUND OF THE INVENTION

Ion implantation has become a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or a solid material into a well-defined ion beam. The ion beam is mass analyzed to eliminate undesired species, is accelerated to a desired energy and is directed onto a target plane. The beam may be distributed over the target area by beam scanning, by target movement or by a combination of beam scanning and target movement. Examples of prior art ion implanters are disclosed in U.S. Pat. No. 4,276,477 issued Jun. 30, 1981 to Enge; U.S. Pat. No. 4,283,631 issued Aug. 11, 1981 to Turner; U.S. Pat. No. 4,899,059 issued Feb. 6, 1990 to Freytsis et al.; U.S. Pat. No. 4,922,106 issued May 1, 1990 to Berrian et al.; and U.S. Pat. No. 5,350,926 issued Sep. 27, 1994 to White et al.

A well-known trend in the semiconductor industry is toward smaller, higher speed devices. In particular, both the lateral dimensions and the depths of features in semiconductor devices are decreasing. State of the art semiconductor devices require junction depths less than 1,000 Angstroms and may eventually require junction depths on the order of 200 Angstroms or less.

The implanted depth of the dopant material is determined, at least in part, by the energy of the ions implanted into the semiconductor wafer. Shallow junctions are obtained with low implant energies. However, ion implanters are typically designed for efficient operation at relatively high implant energies, for example in the range of 20 keV to 400 keV, and may not function efficiently at the energies required for a shallow junction implantation. At low implant energies, such as energies of 2 keV and lower, the current delivered to the wafer is much lower than desired and in some cases may be near zero. As a result, extremely long implant times are required to achieve a specified dose, and throughput is adversely affected. Such reduction in throughput increases fabrication cost and is unacceptable to semiconductor device manufacturers.

Plasma doping systems have been studied for forming shallow junctions in semiconductor wafers. In one type of plasma doping system, a semiconductor wafer is placed on a conductive platen, which functions as a cathode, located in a plasma doping chamber. An ionizable gas containing the desired dopant material is introduced into the chamber, and a voltage pulse is applied between the platen and an anode, causing formation of a glow discharge plasma having a plasma sheath in the vicinity of the wafer. The applied voltage pulse causes ions in the plasma to cross the plasma sheath and to be implanted into the wafer. The depth of implantation is related to the voltage applied between the wafer and the anode. Very low implant energies can be achieved. Plasma doping systems are described, for example, in U.S. Pat. No. 5,354,381 issued Oct. 11, 1994 to Sheng; U.S. Pat. No. 6,020,592 issued Feb. 1, 2000 to Liebert et al.; and U.S. Pat. No. 6,182,604 issued Feb. 6, 2001 to Goeckner et al.

In other types of plasma systems, known as plasma immersion systems, a continuous RF voltage is applied between the platen and the anode, thus producing a continuous plasma. At intervals, a high voltage pulse is applied between the platen and the anode, causing positive ions in the plasma to be accelerated toward the wafer.

The fabrication of state of the art semiconductor devices may require a number of implant steps at energies ranging from very low to relatively high. The low energy processing steps may require long implant times in a beamline ion implanter or the expense of a plasma doping system in addition to the beamline ion implanter. Accordingly, there is a need for improved processing systems and methods for implanting dopant materials into workpieces over a range of energies, including very low energies.

SUMMARY OF THE INVENTION

According to a first aspect of the invention, apparatus is provided for processing a semiconductor wafer. The apparatus comprises a process chamber, a beamline ion implant module for generating an ion beam and directing the ion beam into the process chamber, a plasma doping module including a plasma doping chamber that is accessible from the process chamber, and a wafer positioner for positioning a semiconductor wafer in the path of the ion beam in a beamline implant mode and for positioning the semiconductor wafer in the plasma doping chamber in a plasma doping mode.

The plasma doping chamber may be located within the process chamber and may be movable between a plasma doping position and a retracted position. A first vacuum pump may be coupled through a first pumping port to the process chamber, and a second vacuum pump may be coupled through a second pumping port to the plasma doping chamber. The plasma doping chamber may be isolated from the process chamber in the plasma doping mode.

The wafer positioner may comprise a platen for holding the wafer and a platen positioner for positioning the platen. The platen may be movable between a beamline implant position, a plasma doping position and a wafer transfer position. The plasma doping chamber may include an opening in communication with the process chamber, wherein the platen is movable into sealed engagement with the opening in the plasma doping chamber. The platen may comprise an electrostatic wafer clamp. The platen positioner may comprise means for mechanically scanning the platen with respect to the ion beam in the beamline implant mode.

The apparatus may further comprise a controller for selecting the beamline implant mode or the plasma doping mode and for controlling the wafer positioner according to the selected mode. The apparatus may further comprise a wafer handler for loading a wafer on the platen for processing and for removing the wafer from the platen following processing.

The plasma doping module may include an anode positioned within the plasma doping chamber and a pulse source coupled between the anode and the platen. In one embodiment, the platen is connected to a reference potential and pulses are applied to the anode by the pulse source. In another embodiment, the anode is connected to a reference potential and pulses are applied to the platen by the pulse source.

The plasma doping module may further include a hollow electrode surrounding a space between the anode and the platen. In one embodiment, a hollow electrode pulse source is coupled to the hollow electrode. In another embodiment, the hollow electrode is electrically coupled to the anode.

The apparatus may further comprise an anode positioner for controlling the spacing between the anode and the platen. A chamber positioner may be provided for moving the plasma doping chamber between a plasma doping position and a retracted position.

In one embodiment, a vacuum pump is coupled to the process chamber. The plasma doping module includes a controlled conductance aperture between the interior volume of the plasma doping chamber and the process chamber, and a process gas source coupled to the plasma doping chamber. The interior volume of the plasma doping chamber is pumped by the vacuum pump through the controlled conductance aperture in the plasma doping mode. In another embodiment, a process gas source and a vacuum pump are coupled to the plasma doping chamber. The interior volume of the plasma doping chamber is pumped by the vacuum pump in the plasma doping mode.

According to another aspect of the invention, a method is provided for processing a semiconductor wafer. The method comprises the steps of positioning a semiconductor wafer in a process chamber, processing the wafer in the process chamber by ion implantation in a beamline implant mode, and processing the wafer in the process chamber by plasma doping in a plasma doping mode.

The step of processing the wafer by ion implantation may comprise directing an ion beam at a surface of the wafer. The step of processing the wafer by plasma doping may comprise processing the wafer in a plasma doping chamber that is accessible from the process chamber. The step of positioning the wafer may comprise mounting the wafer on a support platen located in the process chamber. The method may further comprise the step of moving the plasma doping chamber between a plasma doping position and a retracted position.

BRIEF DESCRIPTION OF THE DRAWINGS

For a better understanding of the present invention, reference is made to the accompanying drawings, which are incorporated herein by reference and in which.

DETAILED DESCRIPTION

Figure 1A:
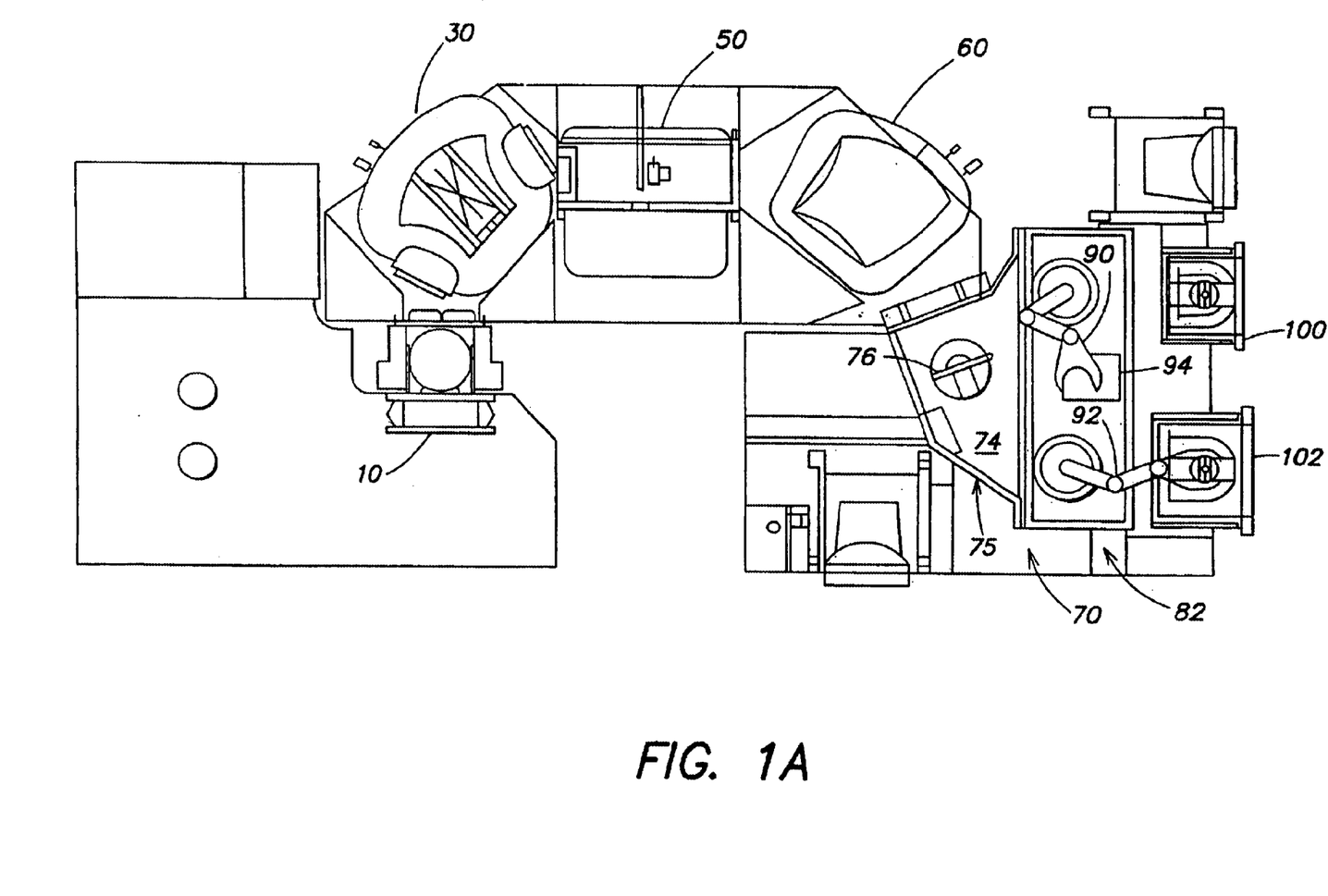
FIG. 1A is a top schematic view of a beamline ion implanter suitable for implementation of the present invention.
Figure 1B:
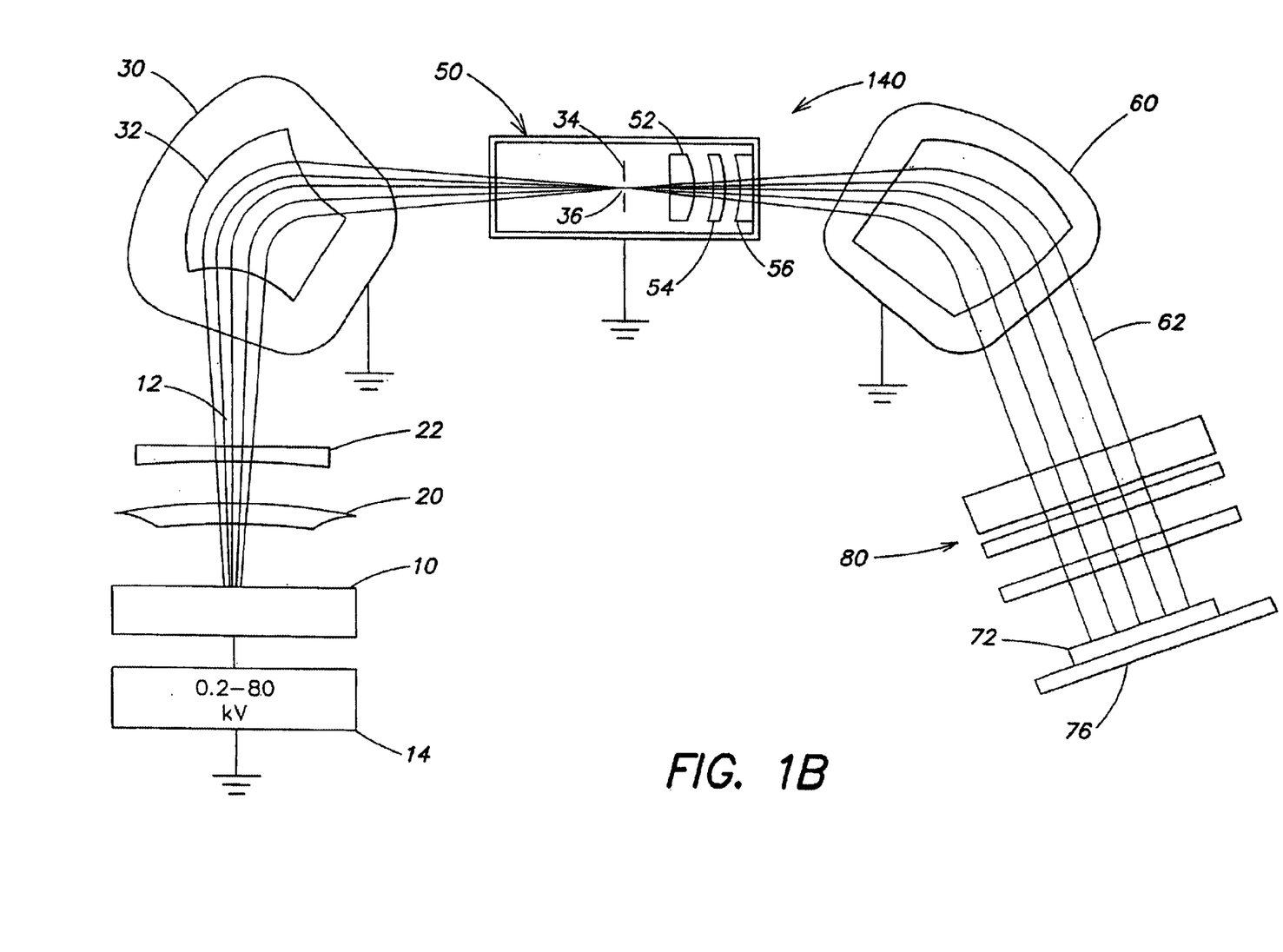
FIG. 1B is a top schematic view of the beamline ion implanter of FIG. 1A, showing beamline components.

A block diagram of an embodiment of a beamline ion implanter suitable for implementation of the invention is shown in FIGS. 1A and 1B. An ion source 10 generates ions and supplies an ion beam 12. As known in the art, ion source 10 may include an ion chamber and a gas box containing a gas to be ionized. The gas is supplied to the ion chamber where it is ionized. The ions thus formed are extracted from the ion chamber to form ion beam 12. Ion beam 12 has an elongated cross-section and is ribbon-shaped, with a long dimension of the beam cross-section preferably having a horizontal orientation. A power supply 14 is connected to an extraction electrode of ion source 10 and provides a voltage that may be adjustable, for example, from about 0.2 to 80 keV. Thus, ions from ion source 10 are accelerated to energies of about 0.2 to 80 keV by the voltage from power supply 14. The construction and operation of ion sources are well-known to those skilled in the art.

Ion beam 12 passes through a suppression electrode 20 and a ground electrode 22 to a mass analyzer 30. The mass analyzer 30 includes a resolving magnet 32 and a masking electrode 34 having a resolving aperture 36. Analyzing magnet 32 deflects ions in ion beam 12 such that ions of a desired ion species pass through resolving aperture 36, and undesired ion species do not pass through resolving aperture 36 but are blocked by the masking electrode 34. In a preferred embodiment, resolving magnet 32 deflects ions of a desired species by 90°.

Ions of the desired species pass through resolving aperture 36 to a first deceleration stage 50 positioned downstream of mass analyzer 30. Deceleration stage 50 may include an upstream electrode 52, a suppression electrode 54 and a downstream electrode 56. Ions in the ion beam are decelerated by deceleration stage 50 and then pass through an angle corrector magnet 60. Angle corrector magnet 60 deflects the ions and converts the ion beam from a diverging ion beam to a ribbon beam 62 having substantially parallel ion trajectories. In a preferred embodiment, angle corrector magnet 60 deflects ions of the desired species by 70°. The ion implanter may include a second deceleration stage 80 positioned downstream of angle corrector magnet 60.

An end station 70, or process station, supports one or more semiconductor wafers, such as wafer 72, in a process chamber 74 such that ions of the desired species are implanted into the semiconductor wafer. Process chamber 74 is enclosed by a vacuum vessel 75. The end station 70 may include a cooled electrostatic platen 76 and a platen positioner 78 (FIG. 4) for mechanically scanning wafer 72 perpendicular to the long dimension of the ribbon ion beam 62, so as to distribute the ions over the surface of wafer 72.

End station 70, as shown in FIG. 1A, may include an automated wafer handler 82 for introducing wafers into the ion implanter and for removing wafers after implantation. Wafer handler 82 shown in FIG. 1A includes wafer robots 90 and 92, a wafer orienter 94 and load locks 100 and 102. One of the wafer robots removes a wafer from a cassette or other wafer carrier in one of the load locks and transfers the wafer to platen 76. The wafer may be oriented at wafer orienter 94. Following processing, the wafer is removed from platen 76 and is returned to its cassette or other wafer carrier by one of the wafer robots.

End station 70 may also include a dose measuring system, a plasma flood gun or an electron flood gun, and other known components. It will be understood that the entire path traversed by the ion beam is evacuated during ion implantation.

In accordance with an aspect of the invention, a plasma doping module is combined with a beamline ion implant module to form an integrated processing system. The integrated processing system may be used to process wafers by beamline ion implantation, by plasma doping, or both, depending on the required implant recipe for the wafers. Wafers in a single process chamber may have access to a beamline ion implant module and to a plasma doping module. The integrated processing system may include any beamline ion implant module and any plasma doping module. A variety of different beamline ion implanter architectures are known to those skilled in the art. Various plasma doping architectures are described below.

The beamline ion implant module may include all or part of a beamline ion implanter. In one embodiment, described below, a plasma doping module is incorporated into the end station of a beamline ion implanter. In another embodiment, the end station of a beamline ion implanter is replaced with a process chamber. The process chamber is connected to a beamline ion implant module and contains or is connected to a plasma doping module.

Figure 2:
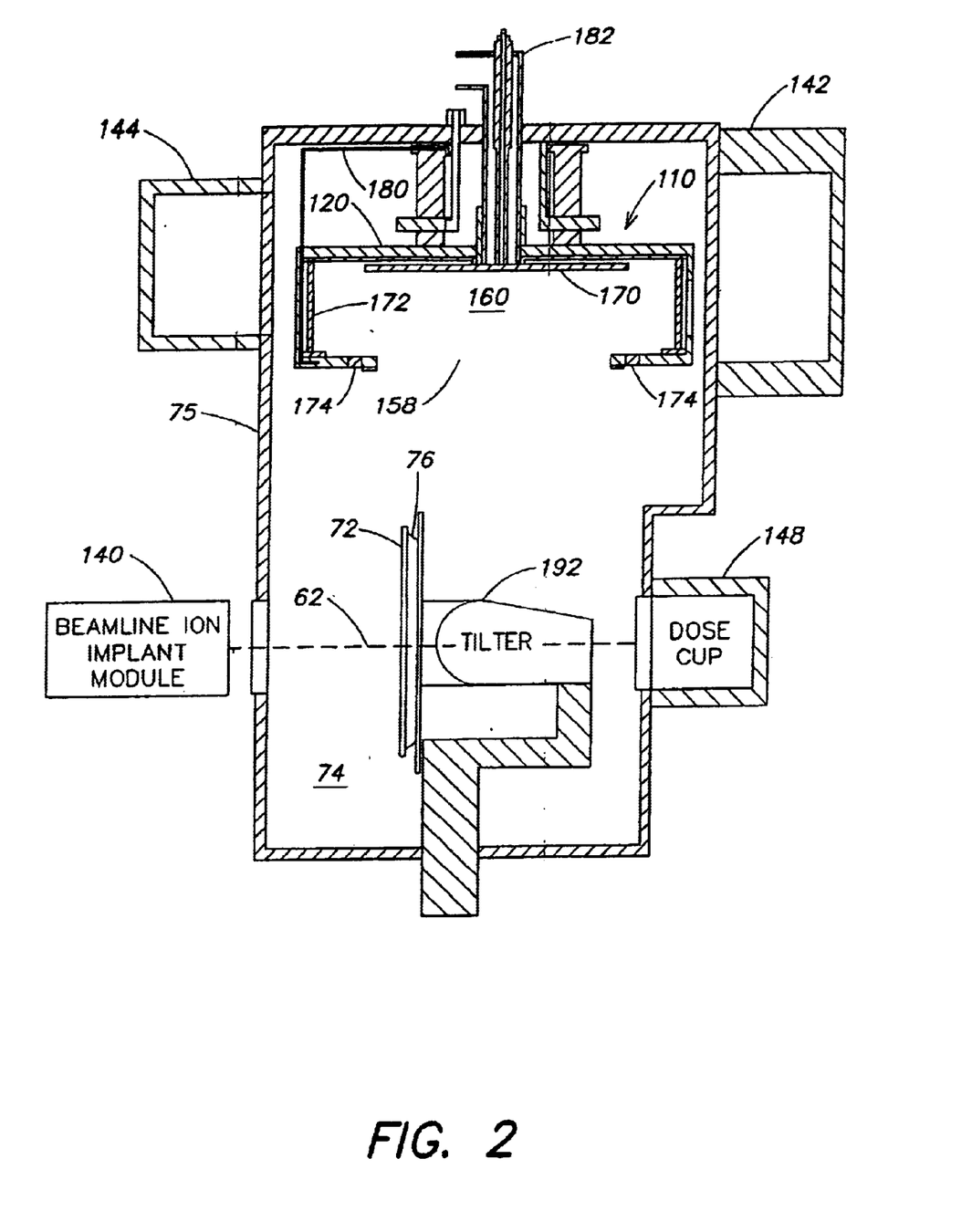
FIG. 2 is a schematic cross-sectional side view of a process system in accordance with an embodiment of the invention, shown in the beamline ion implant mode.
Figure 3:
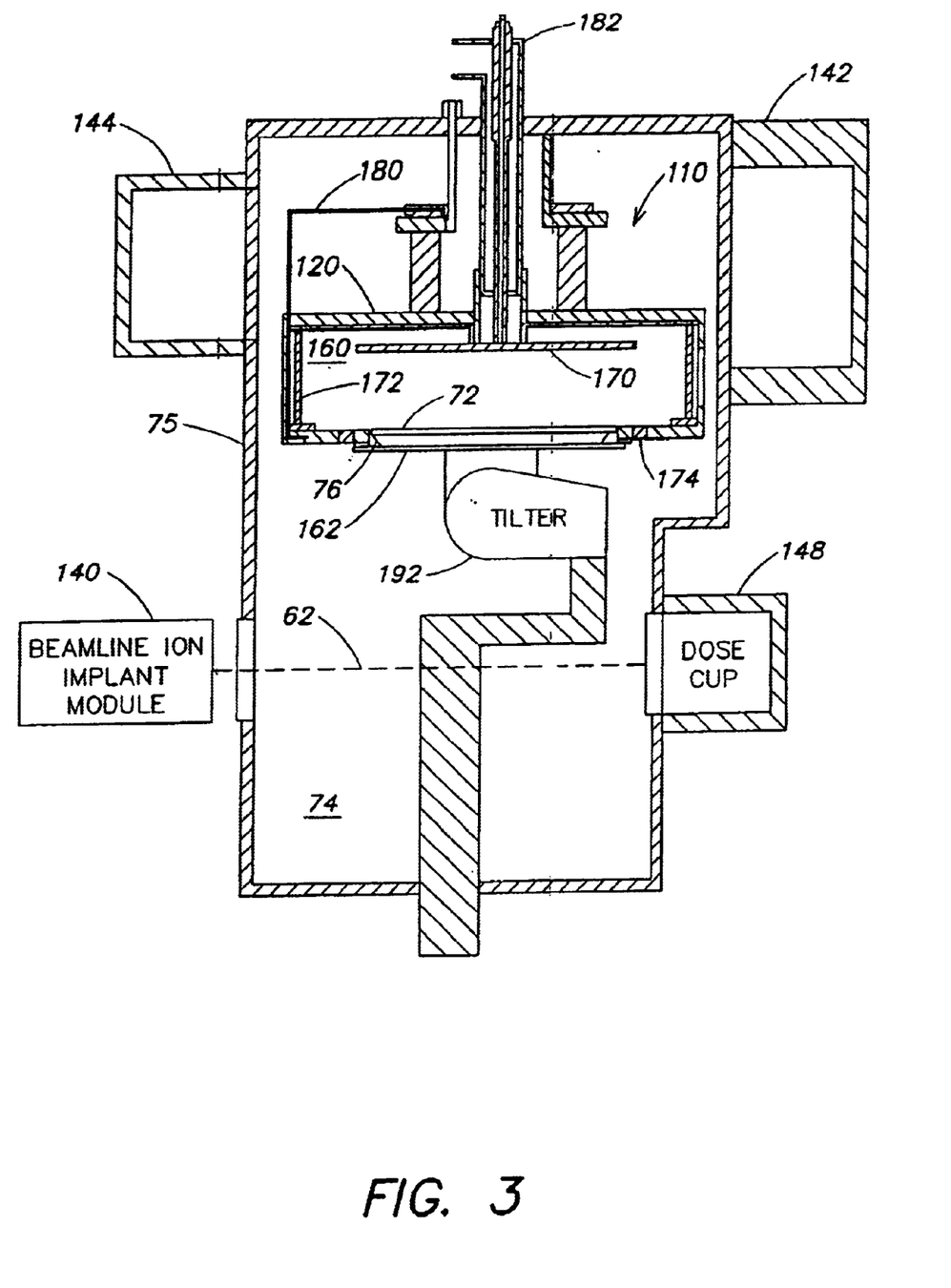
FIG. 3 is a schematic cross-sectional side view of the process system of FIG. 2, shown in the plasma doping mode.
Figure 4:
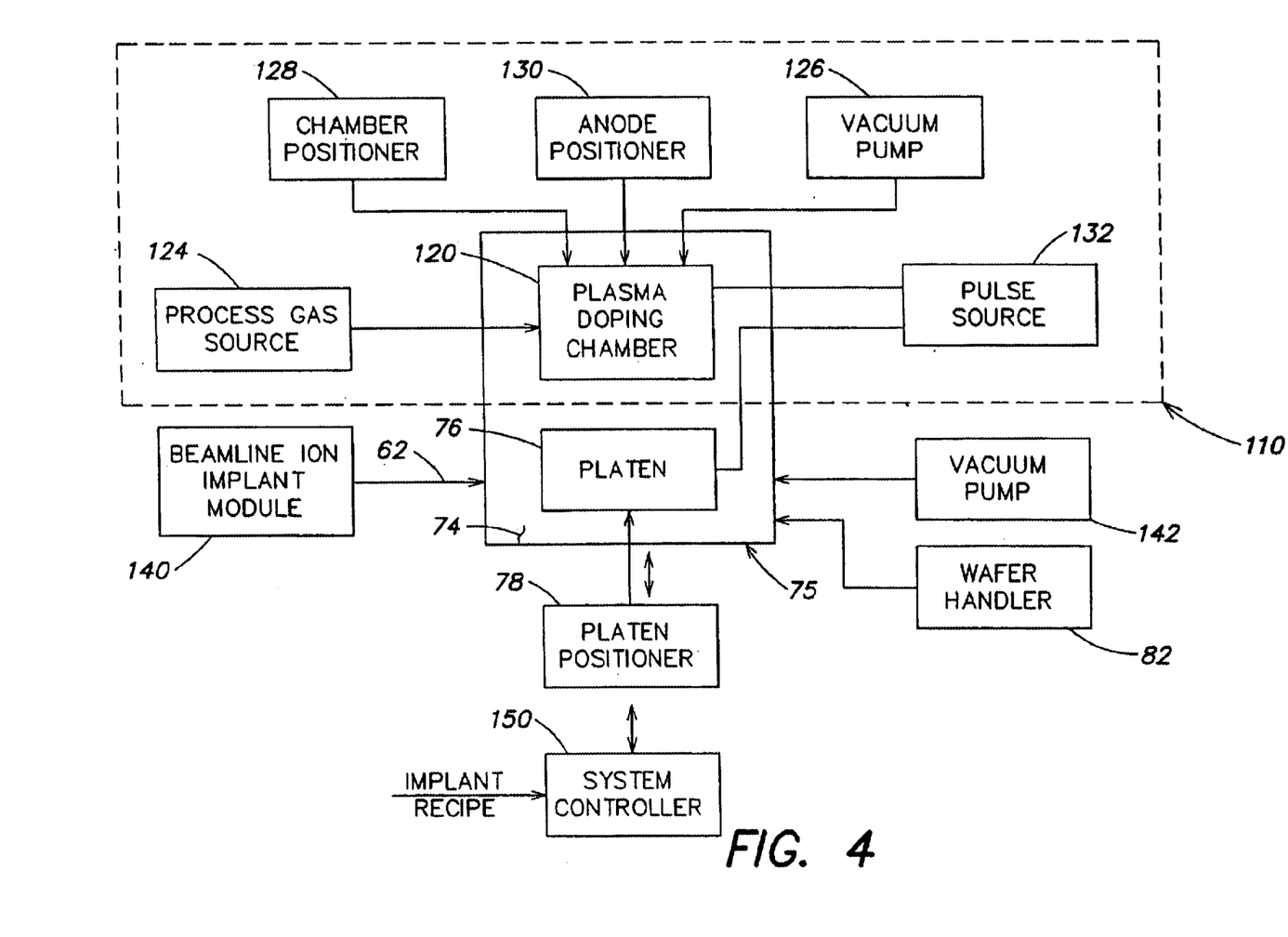
FIG. 4 is a schematic block diagram of the process system of FIGS. 2 and 3.

In an embodiment shown in FIGS. 2–4, a plasma doping module 110 is incorporated into process chamber 74, with one or more components of plasma doping module 110 located within vacuum vessel 75 and one or more components of plasma doping module 110 located outside vacuum vessel 75, as shown in FIG. 4. Plasma doping module 110 may include a plasma doping chamber 120, a process gas source 124, a vacuum pump 126, a chamber positioner 128, an anode positioner 130 connected to an anode located in plasma processing chamber 120, and a pulse source 132 connected between platen 76 and the anode in plasma doping chamber 120. Process gas source 124 and vacuum pump 126 are connected by gas conduits to plasma doping chamber 120, and chamber positioner 128 is mechanically connected to plasma doping chamber 120. Additional embodiments of plasma doping module 110 are described below.

A beamline ion implant module 140 supplies ribbon ion beam 62 to process chamber 74. Referring to FIGS. 1A and 1B, the components of beamline ion implant module 140 may include ion source 10, mass analyzer 30, deceleration stage 50, angle corrector magnet 60 and second deceleration stage 80. The beamline ion implant module 140 may employ any beamline ion implanter architecture.

Additional components of the integrated processing system include vacuum vessel 75, platen 76, platen positioner 78 and wafer handler 82. In a preferred embodiment, platen 76 may be an electrostatic wafer clamp as described for example in U.S. Pat. No. 5,452,177 issued Sep. 19, 1995 to Frutiger. A vacuum pump 142 controls the pressure within process chamber 74. In the embodiment of FIGS. 2 and 3, vacuum pump 142 comprises a cryogenic pump. Additional vacuum pumps, such as a turbomolecular pump 144, may be used for increased vacuum pumping capability. A Faraday cup 148 may be positioned in alignment with ribbon ion beam 62 for dose and uniformity measurements. A system controller 150 controls the elements of the integrated processing system. System controller may comprise a programmed general purpose computer, including for example a microprocessor, memory, interfaces to the components of the integrated processing system and peripheral devices, such as a keyboard and a video display terminal.

Platen 76 holding wafer 72 may be positioned to intercept ribbon ion beam 62 in a beamline implant mode, as shown in FIG. 2, or may be positioned in plasma doping chamber 120 in a plasma doping mode, as shown in FIG. 3. The system thus constitutes an integrated processing system that is capable of beamline ion implantation and plasma doping. The system controller 150 controls the operating mode in response to inputs that define the parameters of each implant.

Referring to FIGS. 2 and 3, plasma doping chamber 120 defines an enclosed volume 160 in the plasma doping mode. In the plasma doping mode shown in FIG. 3, platen 76 is positioned in an opening 158 in plasma doping chamber 120, and a platen halo 162 seals platen 76 into plasma doping chamber 120. Platen 76 thus positions wafer 72 within plasma doping chamber 120. The platen 76 supports wafer 72 and provides an electrical connection to wafer 72. An anode 170 is positioned within plasma doping chamber 120 in spaced relation to platen 76, which functions as a cathode. Anode 170 may be movable by anode positioner 130 (FIG. 4) in a direction perpendicular to the surface of platen 76. The region between platen 76 and anode 170 may be surrounded by a hollow electrode 172 as described in U.S. Pat. No. 6,182,604 issued Feb. 6, 2001 to Goeckner et al., which is hereby incorporated by reference. A shield ring 174 containing a Faraday beam sensor may surround platen 76 as described in U.S. Pat. No. 6,020,592 issued Feb. 1, 2000 to Liebert et al., which is hereby incorporated by reference. The enclosed volume 160 within plasma doping chamber 120 may be connected by a coaxial gas line 180 to process gas source 124 (FIG. 4). In addition, enclosed volume 160 may be connected through a throttled pumping port 182 to vacuum pump 126 (FIG. 4). Plasma doping chamber 120 is preferably movable by chamber positioner 128 (FIG. 4) between a plasma doping position shown in FIG. 3 and a retracted position shown in FIG. 2. The plasma doping chamber 120 moves upwardly from the plasma doping position to the retracted position.

The platen positioner 78 (FIG. 4) positions platen 76 in accordance with the operating mode of the processing system. In the beamline implant mode shown in FIG. 2, platen 76 and wafer 72 are oriented vertically in the path of ribbon ion beam 62, and platen 76 is mechanically scanned upwardly and downwardly by platen positioner 78 to distribute ribbon ion beam 62 over the surface of wafer 72. Platen positioner 78 may include a tilter 190 for tilting wafer 72 at a desired angle with respect to ribbon ion beam 62. Preferably, platen 76 is moved below ribbon ion beam 62 during part of the mechanical scan to permit Faraday cup 148 to monitor ion beam current.

In the plasma doping mode, the platen 76 and wafer 72 may be oriented horizontally. Platen 76 and wafer 72 are moved upwardly into opening 158 in plasma process chamber 120, and platen halo 162 is sealed to plasma process chamber 120. Thus, platen 76 and wafer 72 are sealed into plasma doping chamber 120 as shown in FIG. 3. During plasma doping, platen 76 and wafer 72 may remain stationary.

In a wafer exchange mode, platen 76 and wafer 72 are oriented horizontally and are lowered below the path of ribbon ion beam 62. Wafer 72 is removed from platen 72 by one of the wafer robots 90, 92 (FIG. 1A) and a new wafer is placed on platen 76 for processing. Wafer handling techniques are known to those skilled in the art and are not discussed further.

In operation, the system controller 150 may receive an implant recipe that specifies the parameters for doping a batch of wafers. The implant recipe may, for example, specify a dopant species, an energy and a dose to be applied to the wafers. The system controller 150 may select an operating mode based on the implant recipe. For example, implant energies greater than 2 keV may utilize the beamline implant mode and energies less than 2 keV may utilize the plasma doping mode.

When the beamline implant mode is selected by system controller 150, a wafer of the batch is loaded onto platen 76 by wafer handler 82 and platen 76 is rotated to the vertical position as shown in FIG. 2. The beamline ion implant module 140 is tuned to provide the desired implant parameters and to generate ribbon ion beam 62. The platen positioner 78 mechanically scans platen 76 and wafer 72 vertically through ribbon ion beam 62, typically multiple times, until a desired dose and dose uniformity are achieved. Dose and dose uniformity may be monitored by Faraday cup 148. During the beamline implant mode, the plasma doping chamber 120 remains in the retracted position shown in FIG. 2 in order to provide clearance for mechanical scanning, and the components of plasma doping module 122 are inactivated. Following completion of processing, the wafer 72 may be removed from the process chamber 74 by wafer handler 82.

When the plasma doping mode is selected by system controller 150, the beamline ion implant module 140 is inactivated, and plasma doping chamber 120 is lowered by chamber positioner 128 to the plasma doping position shown in FIG. 3. After a wafer is loaded onto platen 76 by wafer handler 82, the platen 76 and wafer 72 are raised into the opening 150 in plasma doping chamber 120 and are sealed into plasma doping chamber 120. The process gas source 124 and the vacuum pump 126 are activated to provide a process gas at the desired pressure within plasma doping chamber 120. The pulse source 132 is activated, causing formation of a plasma between platen 76 and anode 170 and acceleration of ions toward wafer 72. For very low energy implants, hollow electrode 172 may be utilized as described below. The applied dose may be monitored by the Faraday beam sensor in shield ring 174. When the desired dose is achieved, the pulse source 132 and the process gas source 124 are deactivated, and vacuum pump 126 pumps the plasma doping chamber 120 to a desired vacuum level. The platen 76 and wafer 72 are then lowered from plasma doping chamber 120, and wafer 72 may be removed by wafer handler 82. The vacuum pump 142 may pump residual gas that escapes into process chamber 74 when platen 76 is lowered from plasma doping chamber 120. If desired, wafer 72 may be processed by plasma doping and beamline ion implantation without removing wafer 72 from process chamber 74.

It will be understood that the plasma doping chamber 120 defines a process environment in enclosed volume 160 that may be very different from the process environment within process chamber 74. In particular, process chamber 74 is preferably maintained at high vacuum, for example 20 microtorr, during beamline ion implantation. The pressure within plasma doping chamber 120 during operation in the plasma doping mode may be in a range of about 1 millitorr to about 500 millitorr. A process gas, such as $BF_3$, $N_2$, Ar, $PH_3$, $AsH_3$ or $B_2H_6$, for example, may be used.

In the embodiment of FIGS. 2 and 3, plasma doping chamber 120 is located within process chamber 74 and is movable between a plasma doping position and a retracted position. In other embodiments, plasma doping chamber 120 may be fixed in position if the platen positioner 78 provides a sufficient range of platen travel to permit mechanical scanning and access to plasma doping chamber 120. In addition, plasma doping chamber 120 may be located partially or entirely outside process chamber 74, such that the plasma doping chamber 120 can be accessed from process chamber 74. For example, plasma processing chamber 120 may be accessed from process chamber 74 through a gate valve.

Figure 5:
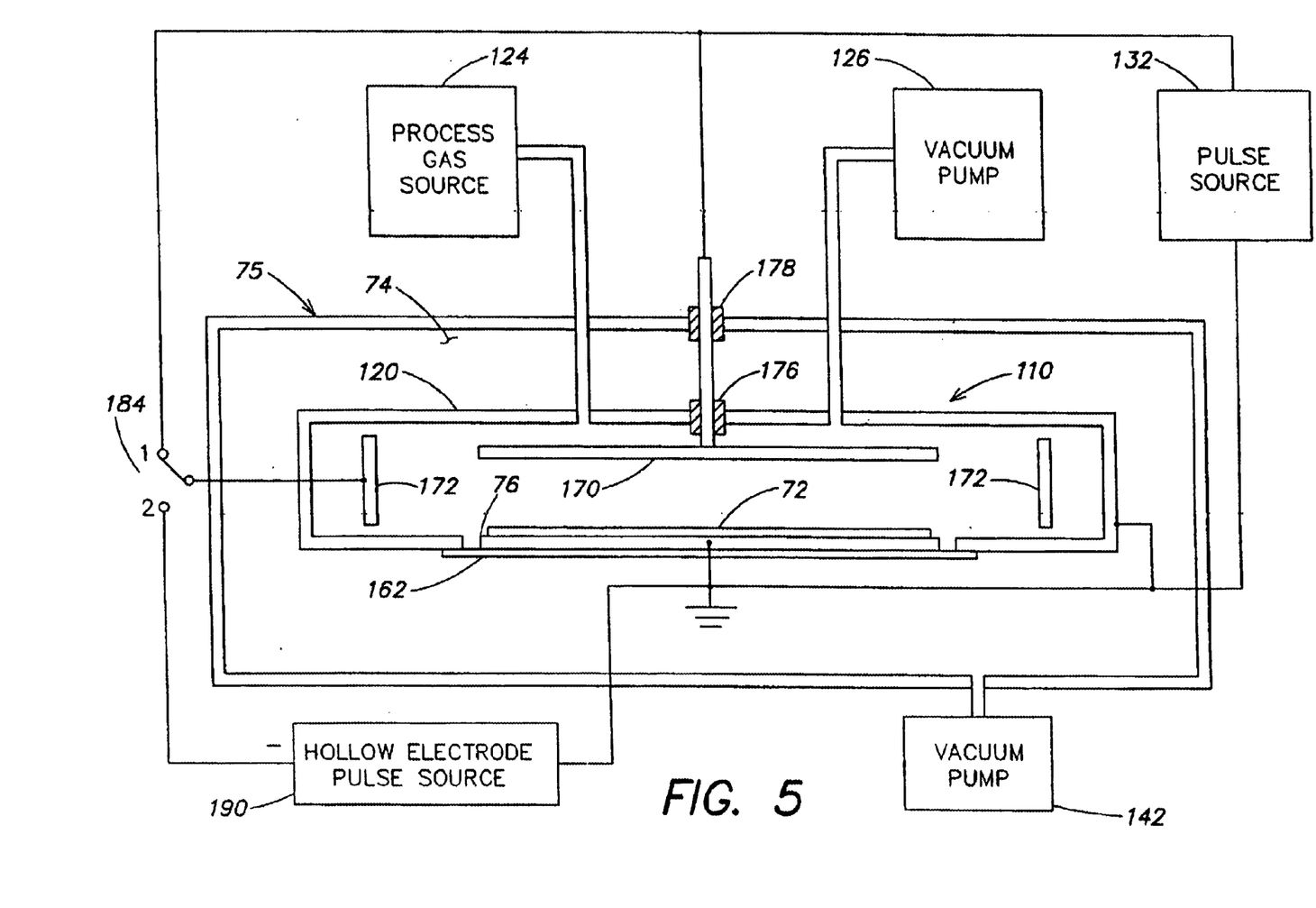
FIG. 5 is a schematic block diagram of a first embodiment of the plasma doping module, shown with the platen sealed into the plasma doping chamber.
Figure 6:
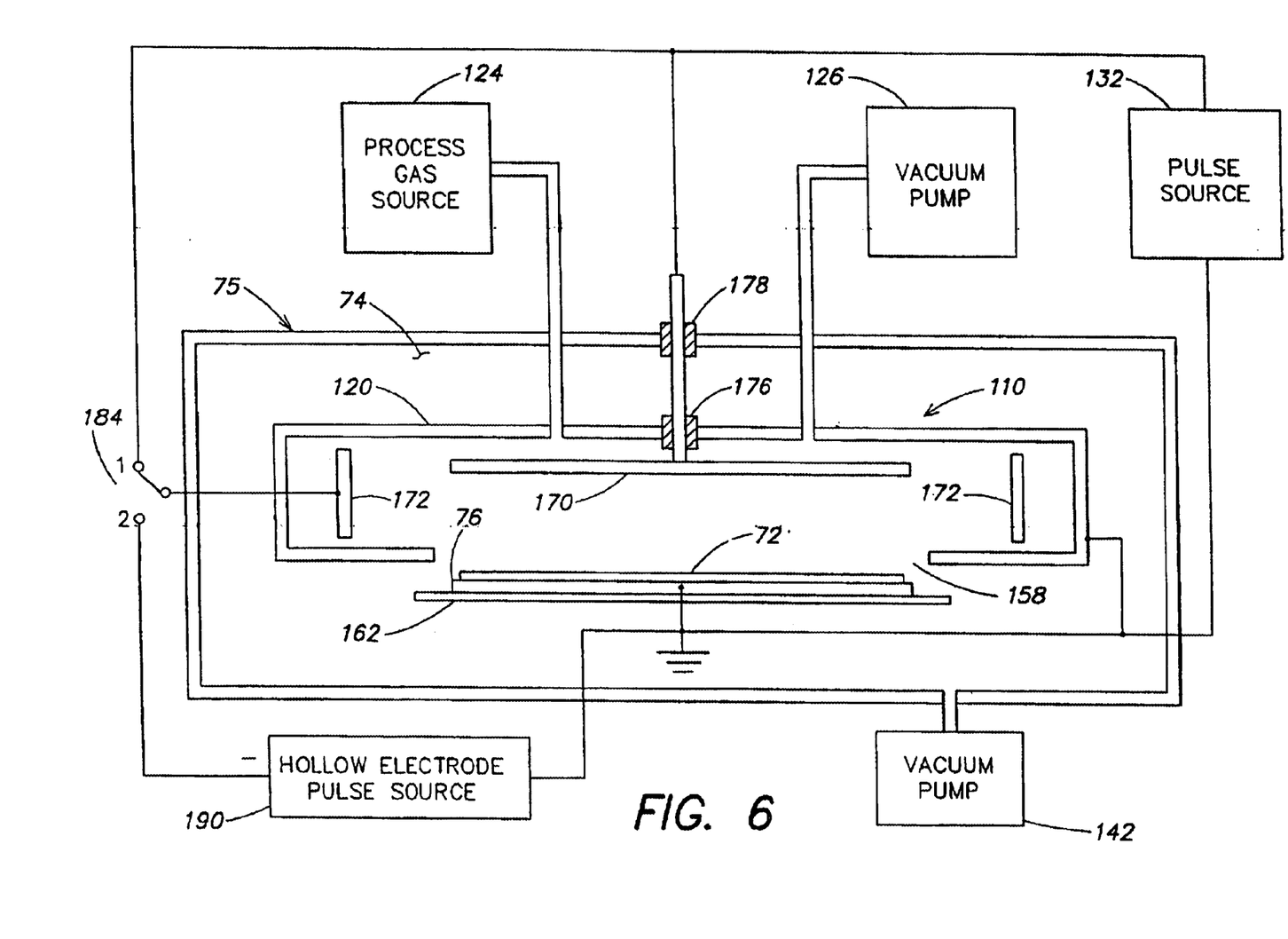
FIG. 6 is a schematic block diagram of the first embodiment of the plasma doping module, shown with the platen removed from the plasma doping chamber.
Figure 7:
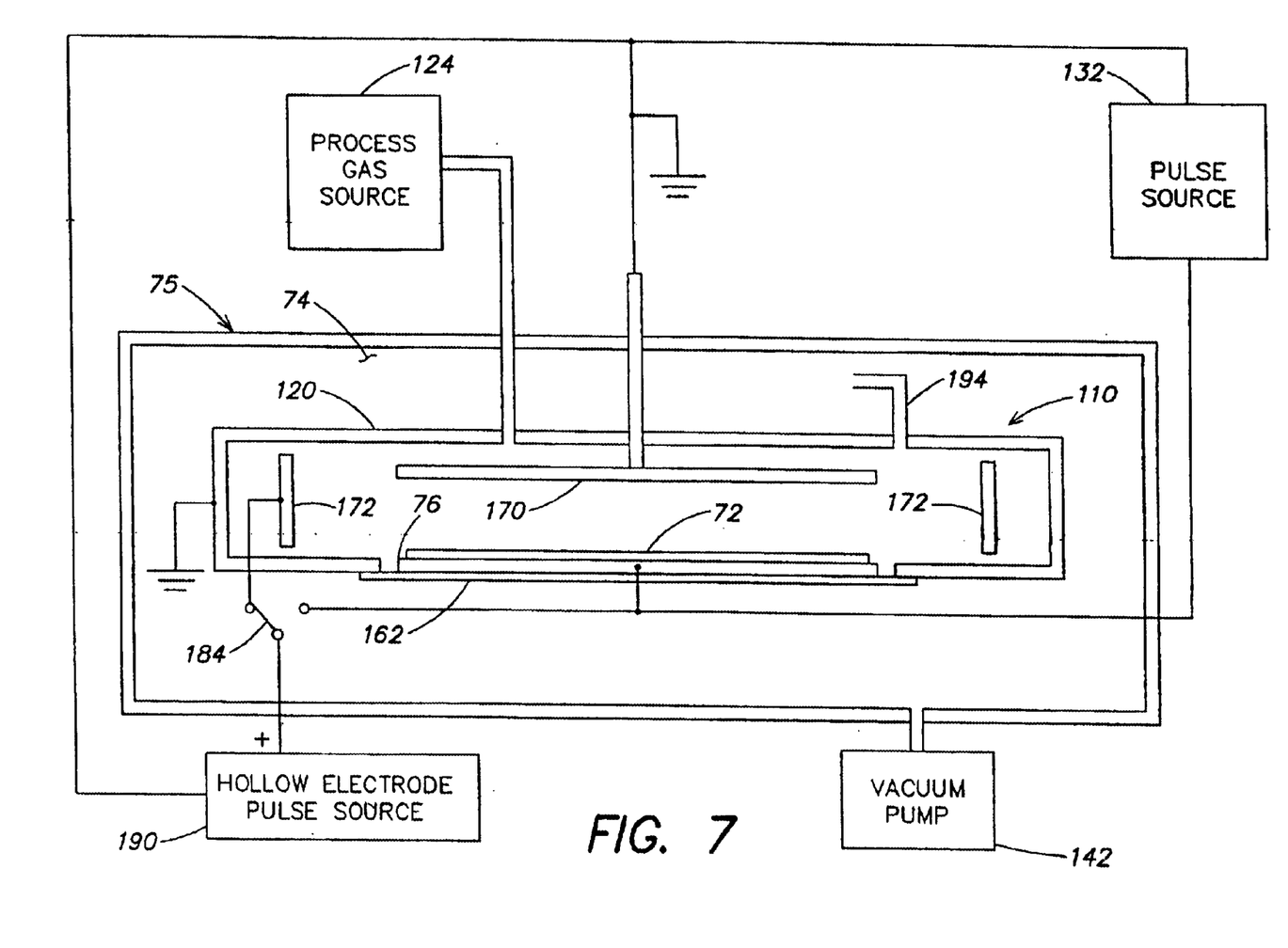
FIG. 7 is a schematic block diagram of a second embodiment of the plasma doping module, shown with the platen sealed into the plasma doping chamber.

Schematic block diagrams of a first embodiment of plasma doping module 110 are shown in FIGS. 5 and 6. A schematic block diagram of a second embodiment of plasma doping module 110 is shown in FIG. 7. Like elements in FIGS. 1–7 have the same reference numerals. In FIGS. 5–7, vacuum vessel 75 and vacuum pump 142 are shown because these elements are involved in the operation of the plasma doping module. The other components of the integrated processing system are omitted in FIGS. 5–7.

In FIG. 5, platen 76 is sealed into plasma doping chamber 120 in the plasma doping mode. In the configuration of FIG. 5, plasma doping chamber 120 is isolated from process chamber 74, and different environments may be maintained in plasma doping chamber 120 and processing chamber 74. In FIG. 6, platen 76 is lowered from opening 158 in plasma doping chamber 120. Thus, plasma doping chamber 120 and process chamber 74 have a common environment. This configuration is applicable to the beamline implant mode and the wafer exchange mode.

As shown in FIGS. 5 and 6, plasma doping chamber 120 is located within vacuum vessel 75. Plasma doping chamber 120 is connected to vacuum pump 126, and vacuum vessel 75 is connected to vacuum pump 142. Vacuum pump 142 pumps both process chamber 74 and plasma doping chamber 120 when platen 76 is lowered from opening 158 in plasma doping chamber 120, as shown in FIG. 6. Thus, plasma doping chamber 120 has a relatively low pressure at the time when platen 76 is sealed into plasma doping chamber 120. After plasma doping chamber 120 is sealed, plasma doping chamber 120 is pumped by vacuum pump 126. This arrangement permits vacuum pump 126 to have a relatively small pumping capacity, while vacuum pump 142 has a larger pumping capacity sufficient to pump vacuum vessel 75. Thus, vacuum pump 142 may be considered as a primary vacuum pump and vacuum pump 126 may be considered as a secondary vacuum pump in the embodiment of FIGS. 5 and 6.

Vacuum pump 142 evacuates plasma doping chamber 120 to a desired pressure level with platen 76 in the lowered position shown in FIG. 6. Platen 76 is then sealed into plasma doping chamber 120 as shown in FIG. 5. Process gas source 124 introduces a process gas to plasma doping chamber 120, and vacuum pump 126 provides sufficient pumping to maintain a desired pressure of the process gas within plasma doping chamber 120. Because vacuum pump 126 is not required to pump plasma doping chamber 120 from atmospheric pressure to the process pressure, the port connecting plasma doping chamber 120 to vacuum pump 126 may be throttled, and vacuum pump 126 may have a relatively small capacity. After processing is complete, process gas source 124 is turned off and vacuum pump 126 pumps the remaining process gas from plasma doping chamber 120. Then, platen 76 is lowered, and vacuum pump 142 provides further vacuum pumping of plasma doping chamber 120.

As further shown in FIGS. 5 and 6, platen 76 and the walls of plasma doping chamber 120 may be connected to a reference potential, such as ground, and pulse source 132 may provide a series of pulses to anode 170. Anode 170 is electrically isolated from plasma doping chamber 120 by an insulator 176 and is electrically isolated from vacuum vessel 75 by an insulator 178. Hollow electrode 172 is connected by a switch 184 to pulse source 132 or to a hollow electrode pulse source 190, as described below.

In the typical case where positive ions are to be implanted into wafer 72, positive pulses are applied to anode 170. In the case where the voltage corresponding to the required implant energy is sufficient to initiate a plasma discharge between anode 170 and wafer 72, pulse source 132 may be used to initiate a plasma discharge and to accelerate ions from the plasma into wafer 72. The positive pulses accelerate positive ions across the plasma sheath and into wafer 72. In the case where negative ions are to be implanted into wafer 72, pulse source 132 applies a negative pulse to anode 170. Where pulse source 132 is used to initiate a plasma discharge between anode 170 and wafer 72, hollow electrode 172 is connected to pulse source 132 by placing switch 184 in position 1 shown in FIGS. 5 and 6. In this configuration, the plasma is substantially surrounded, except at wafer 72, by positively biased anode 170 and hollow electrode 172, and positively charged ions in the plasma are accelerated to wafer 72.

In the case where a very low implant energy is required and the corresponding amplitude of the pulses supplied by pulse source 132 is not sufficient to initiate a plasma discharge between anode 170 and wafer 72, switch 184 is placed in position 2, and hollow electrode 172 is connected to hollow electrode pulse source 190. In the embodiment of FIGS. 5 and 6, a negative pulse is applied to hollow electrode 172 when positive ions are to be implanted into wafer 72. The negative pulse applied to hollow electrode 172 combined with the positive pulse applied to anode 170 is sufficient to initiate a plasma discharge between anode 170 and wafer 72, and a relatively small amplitude pulse applied to anode 170 achieves very low implant energy. For example, where singly-charged positive ions having energies of 500 electron volts are to be implanted into wafer 72, switch 184 is placed in position 2, pulse source 132 is programmed to generate positive 500 volt pulses, and hollow electrode pulse source 190 is programmed to generate negative 1000 volt pulses. The pulse sources 132 and 190 are synchronized to generate pulses that overlap in time. This results in 1500 volt pulses being applied between anode 170 and hollow electrode 172, which is sufficient to initiate a plasma discharge. The positive ions in the plasma discharge are accelerated to 500 electron volts by the pulses applied between anode 170 and wafer 72.

The plasma doping module shown in FIGS. 5 and 6, wherein wafer 72 and plasma 76 are grounded, has several advantages. Because the wafer is grounded, biasing and dose measurement are simplified. The wafer 76 is substantially surrounded by anode 170 and hollow electrode 172, and plasma doping chamber 120 is connected through a throttled pumping port to vacuum pump 126. As a result, contamination of wafer 76 caused by sputtering of chamber walls and vacuum pumping components is limited. In addition, the surface area for collecting ions is limited, thereby reducing the load placed on pulse sources 132 and 190. To further reduce contamination caused by sputtering, hollow electrode 172 and other exposed elements may be coated with a non-contaminating material, such as silicon in the case of a silicon wafer. The throttled pumping port reduces the tendency for ions in the plasma to enter the pumping port and to be deposited on vacuum pumping components.

A schematic block diagram of the second embodiment of plasma doping module 110 is shown in FIG. 7. The embodiment of FIG. 7 differs from the embodiment of FIGS. 5 and 6 with respect to grounding and the electrical connections to pulse source 132 and hollow electrode pulse source 190. In particular, anode 170 is connected to a reference potential, such as ground, and the cathode (platen 76) is pulsed negative for implantation of positive ions. Hollow electrode 170 is connected by switch 184 to platen 76 or to hollow electrode pulse source 190, depending on the required implant energy. In the embodiment of FIG. 7, platen halo 162 is an electrically insulating material to permit electrical isolation between platen 76 and plasma doping chamber 120.

The embodiment of FIG. 7 also differs from the embodiment of FIGS. 5 and 6 with respect to the vacuum pumping arrangement. In particular, plasma doping chamber 120 is provided with a controlled conductance aperture 194, and vacuum pump 126 (FIGS. 5 and 6) is eliminated. The controlled conductance aperture 194 provides a controlled gas flow between the interior volume of plasma doping chamber 120 and process chamber 74. Thus, plasma doping chamber 120 is vacuum pumped by a controlled gas flow through aperture 194 to vacuum pump 142 when platen 76 is sealed into plasma doping chamber 120. The controlled conductance aperture 194 may include one or more openings having known gas flow characteristics. In one embodiment, the openings of aperture 194 avoid a direct line of sight between the interior volume of plasma doping chamber 120 and process chamber 74, to permit gas flow while inhibiting passage of the plasma. For example, aperture 194 may be implemented as a gas conduit having a bend. In the other embodiments, aperture 194 may be fixed, may be opened or closed, or may have an adjustable gas conductance. It will be understood that the vacuum pumping arrangement of FIG. 7 may be used in the embodiment of FIGS. 5 and 6. Further, the vacuum pumping arrangement of FIGS. 5 and 6 may be used in the embodiment of FIG. 7

The plasma doping systems shown in FIGS. 5–7 and described above may be utilized in the integrated processing system shown in FIGS. 2–4 and described above. In addition, the embodiments of FIGS. 5–7 may be utilized separately or in any processing system having an outer vacuum vessel to provide vacuum pumping of the plasma doping chamber as described above. The outer vacuum vessel may or may not include another processing module.

Other plasma doping architectures may be utilized within the scope of the invention. For example, the plasma may be pulsed or continuous. The plasma may be generated by a DC voltage, an RF voltage or a microwave voltage, each of which may be pulsed or continuous. Different process gas pressures may be utilized.

It should be understood that various changes and modifications of the embodiments shown in the drawings described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. Apparatus for processing a semiconductor wafer, comprising:
   a process chamber;
   a beamline ion implant module for generating an ion beam and directing the ion beam into said process chamber;

a plasma doping module including a plasma doping chamber that is accessible from said process chamber; and a wafer positioner for positioning a semiconductor wafer in the path of said ion beam in a beamline implant mode and for positioning the semiconductor wafer in said plasma doping chamber in a plasma doping mode.

2. Apparatus as defined in claim 1 wherein said plasma doping chamber is located within said process chamber.

3. Apparatus as defined in claim 1 wherein said plasma, doping chamber is movable between a plasma doping position and a retracted position.

4. Apparatus as defined in claim 1 further comprising a first vacuum pump coupled through a first pumping port to said process chamber, said plasma doping module further comprising a second vacuum pump coupled through a second pumping port to said plasma doping chamber.

5. Apparatus as defined in claim 1 wherein said wafer positioner comprises a platen for holding said wafer and a platen positioner for positioning said platen.

6. Apparatus as defined in claim 5 wherein said platen is movable between a beamline implant position, a plasma doing position and a wafer transfer position.

7. Apparatus as defined in claim 5 wherein said plasma doping chamber includes an opening in communication with said process chamber and wherein said platen is movable into sealed engagement with the opening in said plasma doping chamber.

8. Apparatus as defined in claim 5 wherein said platen comprises an electrostatic wafer clamp.

9. Apparatus as defined in claim 5 further comprising means for mechanically scanning said platen with respect to said ion beam in the beamline implant mode.

10. Apparatus as defined in claim 5 wherein said platen is mounted near the periphery of a rotating disk.

11. Apparatus as defined in claim 5 further comprising a wafer handler for loading a wafer on said platen for processing and for removing the wafer from said platen following processing.

12. Apparatus as defined in claim 5 wherein said plasma doping module further comprises an anode positioned within the plasma doping chamber and a pulse source coupled between said anode and said platen.

13. Apparatus as defined in claim 12 wherein said platen is connected to a reference potential and pulses are applied to said anode by said pulse source.

14. Apparatus as defined in claim 12 wherein said anode is connected to a reference potential and pulses are applied to said platen by said pulse source.

15. Apparatus as defined in claim 12 wherein said plasma doping module further comprises a hollow electrode surrounding a space between said anode and said platen, and a hollow electrode pulse source coupled to said hollow electrode.

16. Apparatus as defined in claim 12 wherein said plasma doping module further comprises a hollow electrode surrounding a space between said anode and said platen and wherein said hollow electrode is electrically coupled to said anode.

17. Apparatus as defined in claim 12 further comprising an anode positioner for controlling the spacing between said anode and said platen.

18. Apparatus as defined in claim 12 further comprising a chamber positioner for moving said plasma doping chamber between a plasma doping position and a retracted position.

19. Apparatus as defined in claim 1 wherein said plasma doping chamber is sealable from said process chamber in the plasma doping mode.

20. Apparatus as defined in claim 1 further comprising a controller for selecting the beamline implant mode or the plasma doping mode and for controlling said wafer positioner according to the selected mode.

21. Apparatus as defined in claim 1 further comprising a vacuum pump coupled to said process chamber, said plasma doping module further including a controlled conductance aperture between the interior volume of said plasma doping chamber and said process chamber, and a process gas source coupled to said plasma doping chamber, wherein the interior volume of said plasma doping chamber is pumped by said vacuum pump through said controlled conductance aperture in the plasma doping mode.

22. Apparatus as defined in claim 1 wherein said plasma doping module further comprises a process gas source and a vacuum pump, each coupled to said plasma doping chamber, wherein the interior volume of said plasma doping chamber is pumped by said vacuum pump in the plasma doping mode.

23. A method for processing a semiconductor wafer, comprising the steps of:

positioning a semiconductor wafer in a process chamber;

processing the wafer in said process chamber by ion implantation in a beamline ion implant mode; and processing the wafer in said process chamber by plasma doping in a plasma doping mode.

24. A method as defined in claim 23 wherein the step of processing the wafer by ion implantation comprises directing an ion beam at a surface of the wafer.

25. A method as defined in claim 23 wherein the step of processing the wafer by plasma doping comprises processing the wafer in a plasma doping chamber that is accessible from said process chamber.

26. A method as defined in claim 25 wherein the step of positioning the wafer comprises mounting the wafer on a support platen located in said process chamber.

27. A method as defined in claim 25 further comprising the step of moving said plasma doping chamber between a plasma doping position and a retracted position.

28. An integrated processing system comprising:

a process station including a process chamber and a wafer positioner for positioning a semiconductor wafer;

a beamline ion implant module for generating an ion beam and directing the ion beam into said process chamber; and a plasma doping module including a plasma doping chamber located within said process chamber, wherein said wafer positioner positions the semiconductor wafer in the path of said ion beam in a beamline implant mode and positions the semiconductor wafer in said plasma doping chamber in a plasma doping mode.

29. An integrated processing system as defined in claim 28, wherein said process station further comprises a first vacuum pump coupled to said process chamber and wherein said plasma doping module further comprises a second vacuum pump coupled to said plasma doping chamber.

30. An integrated processing system as defined in claim 28, wherein said process station further comprises a vacuum pump coupled to said process chamber, said plasma doping module further comprising a controlled conductance aperture between the interior volume of said plasma doping chamber and said process chamber, and a process gas source coupled to said plasma doping chamber, wherein the interior volume of said plasma doping chamber is pumped by said vacuum pump through said controlled conductance aperture.

31. An integrated processing system as defined in claim 28, wherein said wafer positioner comprises a platen for holding said wafer and a platen positioner for positioning said platen.

32. An integrated processing system as defined in claim 28, further comprising means for mechanically scanning said platen with respect to said ion beam in the beamline implant mode.

33. An integrated processing system as defined in claim 28, further comprising a controller for selecting the beamline implant or the plasma doping and for controlling said wafer positioner according to the selected mode.

* * * * *